United States Patent [19]

Ohno et al.

[11] Patent Number: 5,266,146
[45] Date of Patent: Nov. 30, 1993

[54] MICROWAVE-POWERED PLASMA-GENERATING APPARATUS AND METHOD

[75] Inventors: Yasunori Ohno, Mito; Takashi Iga, Hitachi; Noriyuki Sakudo, Hitachi; Kenichi Natsui, Hitachi; Isao Hashimoto, Hitachi, all of Japan

[73] Assignee: Hitachi, Ltd., Tokyo, Japan

[21] Appl. No.: 763,206

[22] Filed: Sep. 20, 1991

[30] Foreign Application Priority Data

Sep. 20, 1990 [JP] Japan .................. 2-248801

[51] Int. Cl.⁵ ........................... H01L 21/00
[52] U.S. Cl. ................ 156/345; 118/723 MA; 156/643; 204/298.31; 204/298.36; 204/298.37; 427/569; 427/571; 427/575
[58] Field of Search ............ 156/345, 643; 118/723; 204/298.31, 298.36, 298.37, 298.02; 427/39, 569, 571, 575

[56] References Cited

U.S. PATENT DOCUMENTS

| 4,778,561 | 10/1988 | Ghanbari | 156/345 |
| 4,876,983 | 10/1989 | Fukuda et al. | 204/298.37 |
| 4,960,073 | 10/1990 | Suzuki et al. | 118/723 |

FOREIGN PATENT DOCUMENTS

| 62-092322 | 4/1987 | Japan . |
| 63-077120 | 4/1988 | Japan . |
| 63-172429 | 7/1988 | Japan . |
| 63-279599 | 11/1988 | Japan . |
| 1-036769 | 2/1989 | Japan . |
| 1-243343 | 9/1989 | Japan . |
| 2-017636 | 1/1990 | Japan . |
| 2-109236 | 4/1990 | Japan . |
| 2-123640 | 5/1990 | Japan . |

OTHER PUBLICATIONS

IEE, Transaction on Nuclear Science, NS-26, 2 (1979) pp. 2120–2127, Geller.

Primary Examiner—Brian E. Hearn
Assistant Examiner—George Goudreau
Attorney, Agent, or Firm—Antonelli, Terry, Stout & Kraus

[57] ABSTRACT

A plasma-generating apparatus has a plasma discharge chamber having a plasma-generation region. Microwave energy is applied, while introducing plasma-forming gas, and a magnetic field is applied to the plasma-generation region by an electromagnetic coil extending around the chamber. To enhance the field in the plasma-generation region while reducing it outside said region, and a permanent magnet arrangement is at least partly located radially within the coil so as to provide a unidirectional magnetic field which extends through the whole of the plasma-generation region as seen in radial cross-section and is oriented in the axial direction of the coil.

8 Claims, 9 Drawing Sheets

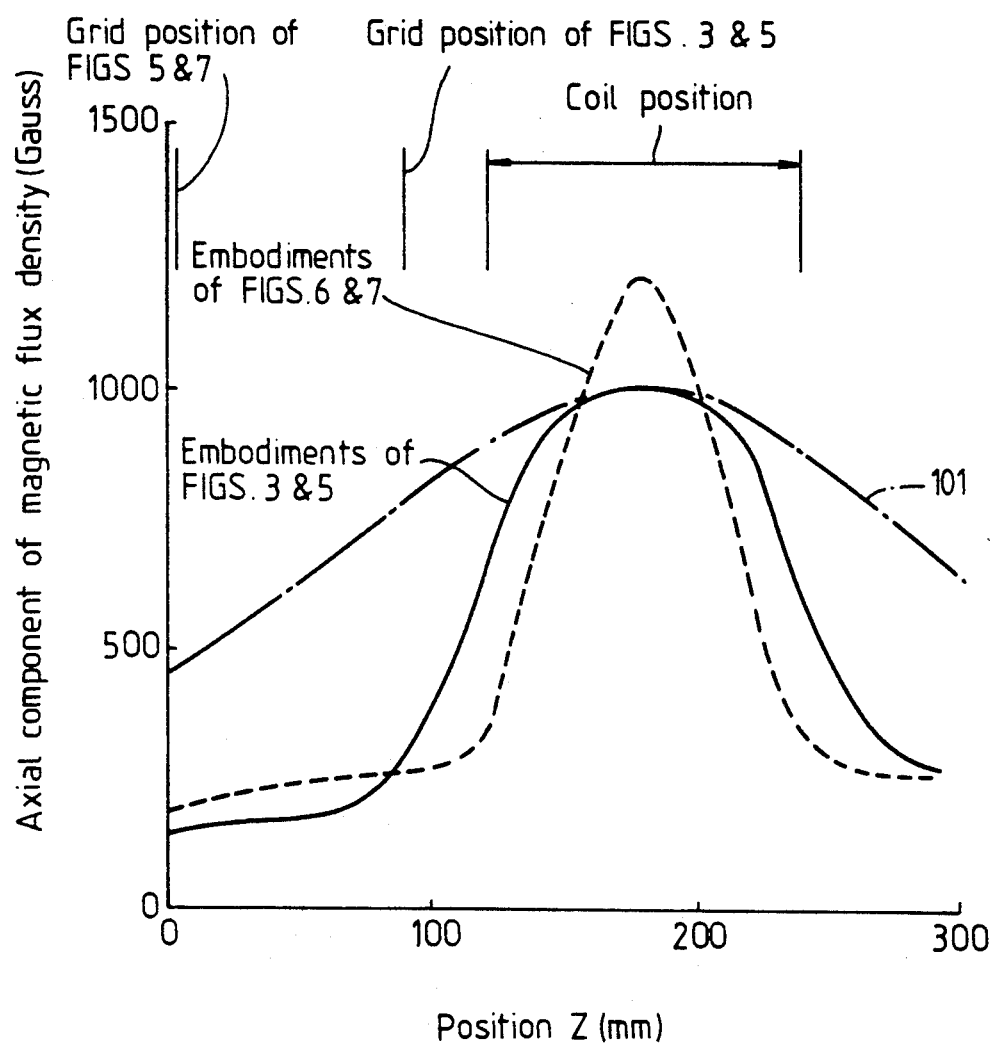

5,266,146

MICROWAVE-POWERED PLASMA-GENERATING APPARATUS AND METHOD

BACKGROUND OF THE INVENTION

1. Field of the invention

The present invention relates to a microwave-powered plasma-generating apparatus and method and, more particularly, is applicable to an ion source suitable for use in an ion milling apparatus or a reactive ion beam etching apparatus and to a plasma apparatus suited for use in a plasma etching process or other plasma process such as plasma CVD.

2. Description of Related Art

An increasing use of plasma-generating apparatus in recent years has been to provide ion beams for ion milling apparatus and reactive ion beam etching apparatus. The variety of design and the high performance of semiconductor integrated circuits and other thin film devices developed recently have led to to use of a fine treatment etching method using a reactive ion beam which has good directional characteristics, in place of the previous etching method using a plasma. Such ion beams are also used in ion milling, in which a non-reactive ionic species, e.g. argon ions, are employed.

To provide an ion source for such ion beam etching or milling apparatus, in the conventional technology there has generally been used a method of generating ions by DC discharge while supplying thermoelectrons from a filament. Such an ion source has the problem that the filament is rapidly consumed, if it is used to produce an ion beam from highly reactive gases such as oxygen or chlorine.

To solve this problem, there has been developed an ion source which does not use any filament, but in which typically a plasma of a suitable gas is established by introducing microwave radiation into a magnetic field generated by a solenoid coil. The ions are extracted from the plasma by an ion extracting electrode.

As an example of this microwave-powered ion source, reference is made to IEEE Transactions on Nuclear Science, vol. NS-26, No. 2, April 1979, pages 2120–2127. One of the apparatuses illustrated is shown in FIG. 1 of the drawings accompanying the present application. Around a discharge chamber 201 are arranged several solenoid coils 202 and a permanent magnet hexapole 203. Although this magnet hexapole is not described in detail, it apparently has the structure shown in FIG. 1(b). Microwave radiation is fed in by a waveguide 207 through a window or port 206, and a gas or plasma of low concentration is supplied through a gas introduction port 213. Plasma is generated in the chamber 201 and ions are extracted into a further vacuum chamber 210 by an ion extracting electrode 215. Vacuum connections are shown at 211 and 212.

The ions established by this apparatus in the plasma, as electrons at higher velocities bombard ions of lower valency, are multivalent. The electrons are confined by the multipolar magnetic field 230 established by the magnet hexapole 203. It is the aim of this disclosure to achieve this production of higher valency ions. As a result of the confinement by the multipolar magnetic field, the number of collisions of the electrons with the ions of lower valency is increased, so that more multivalent ions can be produced than with a structure composed of the solenoid coils only.

FIG. 2 of the accompanying drawings shows another conventional technology published in JP-A-63-279599. Plasma is formed in a vacuum chamber 110 from gas introduced via a port 111. The substrate 117 to be treated is mounted on a holder 116 in the chamber 110. Around the chamber 110 are a solenoid coil 113 and a plurality of permanent magnets having polarities as indicated in FIG. 2. It is stated that an axial magnetic field of about 875 Gauss (0.0875 Tesla) is applied in the chamber 100 by the permanent magnets 118, while microwave radiation is introduced through a window 115 from a waveguide 114. Although the figure in JP-A-63-279599 suggests that the magnetic field generated is as shown on the right-hand side of FIG. 2, the present applicants believe that the field is better represented as at the left-hand side of FIG. 2, which shows an axial field.

The method of operation of the apparatus described in JP-A-63-279599 is to superpose a magnetic field by means of the coil 113 (which is located axially above the magnet 118), until discharge is initiated, after which the current of the coil 113 is cut off.

Another document showing permanent magnets employed axially spaced from a solenoid coil, in a microwave plasma-generator, is U.S. Pat. No. 4,778,561. Specifically, a ring of permanent magnets is arranged around the plasma chamber, at some axial distance from the coil, with each magnet radially directed with a south pole close to the chamber and its north pole remote from the chamber. The aim is to create a more uniform magnetic field at the transverse plane of the permanent magnets, due to the summation of the field produced by the coil and the magnets at that region. It is also stated to be an aim that the magnetic field at the extraction system, which removes ions from the plasma-generation region, is minimal. How this is actually achieved is not clear from this disclosure.

Reference to also made to JP-A-2-123640 which shows a microwave-powered plasma-generating apparatus in which either a conventional solenoid coil or a ring of permanent magnets with their north pole-south pole directions aligned in the axial direction of the apparatus is employed to provide the magnetic field for generation of the plasma. The solenoid coil if provided is located outside the chamber, while the assembly of magnets is inside the vacuum chamber. The wall of the vacuum chamber contains a large number of small permanent magnets arranged with their poles of the same kind opposed to each other, to provide a multipolar magnetic field in the vicinity of the chamber walls. The flux of this multipolar field is indicated as close to the chamber walls and not extending across the chamber to the central region of the microwave window where the plasma is generated.

The problem with the above conventional technology is no attention is directed to control the leakage of magnetic flux in such microwave plasma generators, in order that the magnetic field strength at the region of ion extraction from the plasma, or alternatively at the region of a substrate treated by the plasma, is as low as possible. Curve 101 of FIG. 4 of the accompanying drawings discussed more below indicates how the axial component of magnetic flux density of a solenoid coil varies with axial position. The effect of the solenoid field which remains at the ion extraction zone is to cause dispersion of the extracted ion beam. Moreover, when the ion beam is used in ion milling or reactive ion beam etching or when the plasma is used in plasma etching, a magnetic field which may be of the order of 300 Gauss (0.03 Tesla) may be applied to the workpiece, which undesirably may change the magnetic characteristics of the workpiece, or may have the result that a magnetic material cannot be used as the workpiece. With the increasing desire for magnetic fields of higher strength at the plasma-generating zone, this problem increases.

SUMMARY OF THE INVENTION

An object of the present invention is therefore to provide a plasma-generating apparatus and method, in which the magnetic field flux leakage from the plasma-generation region is minimized.

A further object of the invention is to provide a plasma-generating apparatus and method in which a higher magnetic field can be obtained in the plasma discharge zone, while the magnetic flux leakage outside this zone in the ion extraction region or the workpiece treatment region is minimized, so that an ion beam of low dispersion or divergence can be obtained, or treatment of workpieces can be obtained with high accuracy and even a magnetic workpiece can be used.

Briefly, the present invention provides ion generating apparatus in which the axial field of a solenoid coil surrounding the plasma-generation zone is largely confined to the coil region, at least at the axial end of the coil on the downstream side, i.e. the side at which the plasma ions are taken out of the plasma. Thus the axial field generated by the coil is substantially reduced outside the region of the coil. At the same time, the axial field strength in the coil region is increased. These results are obtained by providing permanent magnets at least partly radially within the coil at the coil region, which magnets provide a unidirectional axial field within the plasma-generation zone. This field is oriented in the same direction as the field produced by the solenoid coil, so that the magnetic field intensity is enhanced in the plasma-generation zone across the whole width of this zone. Thus the permanent magnet arrangement which preferably is a plurality of magnets, is selected so as to provide an axial field i.e. it has north and south poles which are axially spaced apart.

In the specification and claims, the term "unidirectional field" is used in relation to the field generated by a permanent magnet arrangement to indicate that the magnet poles are so arranged that, within the plasma-generation region, the field mainly extends in one direction, and that a multipolar field structure provided by a multipole magnet system, such as those discussed above, is not employed. In any permanent magnet arrangement there is some deviation from unidirectionality at the regions beyond the axially endmost north and south poles, and as discussed below this may amount to a reversal of field direction which is usefully employed in the present invention.

According to the invention in one aspect, there is provided a plasma-generating apparatus having a plasma discharge chamber having a plasma-generation region. The apparatus has means for applying microwave energy to the discharge chamber, and means for introducing plasma-forming gas to the chamber. Means for applying a magnetic field to the plasma-generation region of the chamber comprise at least one electromagnetic coil extending around the chamber for generating in the plasma-generation region a magnetic field oriented in an axial direction of the coil. A permanent magnet arrangement is at least partly located radially within said coil so as to provide a unidirectional magnetic field extending through the whole of said plasma-generation region as seen in radial cross-section and is oriented in the axial direction of said coil.

Preferably the discharge chamber has a second region connected to the plasma-generation region and a plurality of further permanent magnets arranged to generate a multi-polar magnetic field in the second region.

The permanent magnet arrangement at least partly radially within the coil may comprise a plurality of permanent magnets arranged around and outside the discharge chamber so as to provide adjacent the chamber a plurality of north poles axially spaced from a plurality of south poles. Alternatively, the permanent magnet arrangement comprises a plurality of first magnets arranged with north poles adjacent the discharge chamber and south poles radially spaced from the chamber and a plurality of second magnets arranged axially from said first magnets with south poles adjacent the chamber and north poles spaced radially from the chamber.

To enhance microwave entry to the plasma generation region, further magnetic field generating means may be arranged at the microwave entry side of the plasma-generation region, to provide a field extending in the same direction as that of the plasma-generating coil. Thus the discharge chamber may have an axial end comprising a microwave inlet window, there being a waveguide for said microwave radiation extending to the window outside the chamber and further magnetic field generating means arranged around the waveguide so as to generate at the window a magnetic field extending axially in the same direction as the field generated radially within the plasma-generating coil in the discharge chamber by the permanent magnet arrangement. The further magnetic field generating means may be a permanent magnet arrangement or a coil.

A portion of the discharge chamber may be bounded by a microwave guide which is not straight and is surrounded by a magnetic shield.

The invention can be seen as a plasma-generating apparatus having a solenoid coil for generating an axial magnetic field in a plasma-generating chamber to which microwave power is applied, characterized by a permanent magnet arrangement located so as to provide a magnetic field which increases the intensity of the magnetic field generated by the coil in the chamber radially inside the coil and reduces the intensity of the magnetic field generated by the coil at a region outside the coil adjacent at least one axial end of the coil.

In another aspect the invention provides a microwave-powered plasma-generating apparatus having at least one annular solenoid coil extending around a plasma-generating chamber and a plurality of permanent magnet north poles and a plurality of permanent magnet south poles arranged radially within the coil with the north poles spaced axially from the south poles so as to provide a unidirectional magnetic field extending over the whole radial cross-section of the plasma-generating chamber and oriented axially of the coil in the chamber within the coil. One of the sets of poles is preferably located close to the axial end of the coil, at which the plasma is extracted.

The invention also provides a method of generating a plasma comprising supplying a plasma-forming gas and microwave energy to a chamber to which a magnetic field is applied by an electromagnetic coil surrounding the chamber, wherein a permanent magnet arrangement is located inside the coil so as to provide a unidirectional magnetic field which inside the coil and in the chamber extends in the same direction as the field generated by the coil. Preferably the magnetic field intensities applied in the chamber at a central axial point of the coil by the coil (Bc) and the permanent magnet arrangement (Bm) satisfy the relation $0.5 \leq Bc/Bm < 4$.

BRIEF DESCRIPTION OF THE DRAWINGS

Embodiments of the invention will now be described by way of non-limitative example with reference to the accompanying diagrammatic drawings, in which:

FIG. 4 is a graph explaining the characteristics of the leakage magnetic field obtainable in embodiments of the present invention;

DESCRIPTION OF THE PREFERRED EMBODIMENTS

A number of plasma-generating apparatus embodiments of the present invention will be described in detail in the following.

Figure 3A:
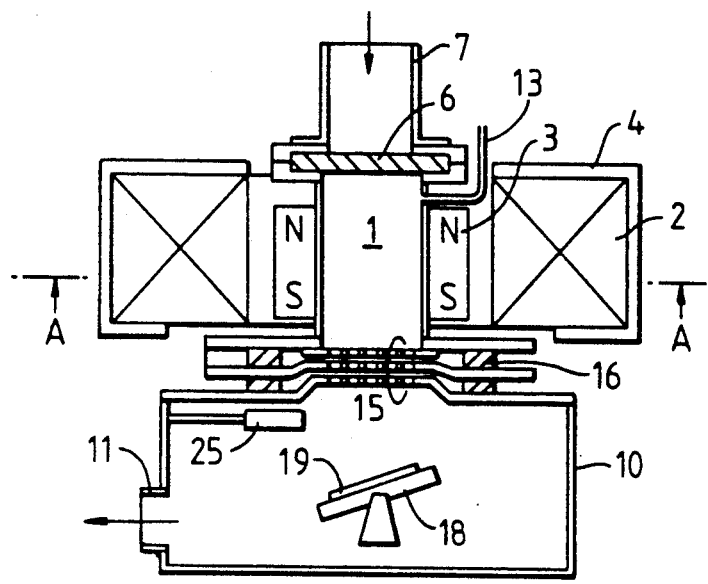
FIGS. 3(a) and 3(b) are sectional views showing the structure of a first embodiment of the present invention.
Figure 3B:
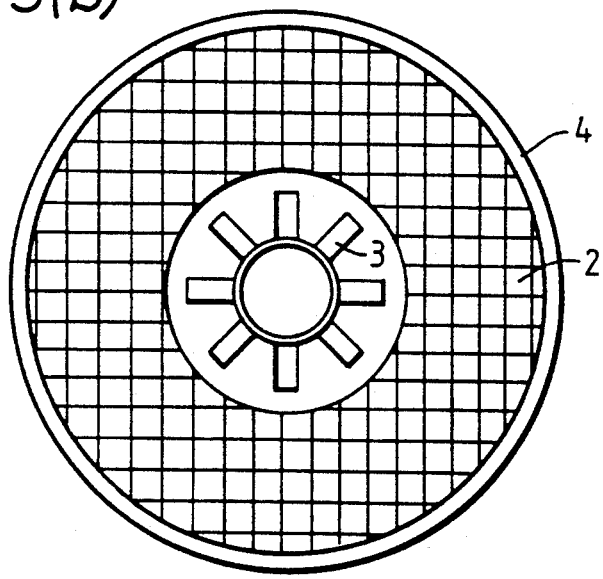

The first embodiment of the present invention, as shown in FIGS. 3(a) and 3(b), is an ion source used in an ion beam etching or low-energy ion implantation machine of non-mass separate type. FIG. 3(b) is a transverse section at line A—A of FIG. 3(a). The ion source shown in FIGS. 3(a) and 3(b) is equipped with a cylindrical discharge chamber 1 and a treatment chamber 10. The treatment chamber 10 is evacuated through the evacuation port 11 by a vacuum pump, not shown. The discharge chamber 1 is made of SUS (stainless steel grade material) and is provided at one end with a microwave-transmitting window or port 6 connected to a waveguide 7, by which microwaves are introduced into the discharge chamber 1 from a microwave generator, not shown. The discharge chamber 1 is further provided with a gas-introducing tube 13.

The discharge chamber 1 has at its other end an ion extracting electrode assembly 15, made by insulating a multi-aperture grid electrically by the insulators 16.

The discharge chamber 1 is surrounded by eight rod-shaped permanent magnets 3 (e.g. Sm-Co magnets), which in turn are surrounded by a solenoid coil 2 and a magnetic shield 4.

The permanent magnets 3 are all arranged to have their N-poles at the end towards the microwave introducing window 6 and their S-poles at the end towards the ion extracting electrode 15. As a result, the direction of the magnetic field established by these magnets in the discharge chamber 1 is aligned with the axial direction of the discharge chamber 1. The solenoid coil 2, which has 800 turns and is cooled with water, also generates during operation an axial field in the chamber 1 in the same direction as the magnets 3.

In the treatment chamber 10, there are shown disposed a substrate holder 18 capable of being swiveled and inclined, a substrate 19 to be treated held by said substrate holder 18, and a neutralizer 25 for supplying electrons for preventing electrification of the substrate 19 by the ions. The substrate 18 is cooled through the substrate holder 18.

Next, the operation of this first embodiment of the invention will be described. First, the treatment chamber 10 is evacuated to a vacuum level of $1 \times 10^{-6}$ Torr ($1.3 \times 10^{-4}$ Pa). With the discharge chamber 1 being supplied with oxygen gas, the solenoid coil 2 is energized to provide an axial magnetic field in the discharge chamber 1 of about 1,000 Gauss (0.1 Tesla). The magnitude of the magnetic field established by the permanent magnets 3 is substantially equal to that of the magnetic field established by the solenoid coil 2, and in the same direction in the chamber 1.

If microwaves of 2.45 GHz are then supplied to the chamber 1, a plasma of the oxygen gas is established in the chamber 1. If the magnitude of the axial magnetic field is varied, the state of the absorption of the microwaves by the plasma is changed to vary the density of the plasma. For an input microwave power of 500W, the plasma density was in one case 2 to $5 \times 10^{11}$ (cm$^{-3}$). The magnitude of the axial magnetic field of the discharge chamber could be adjusted to absorb the microwaves better. If, however, the plasma density in the discharge chamber should be excessively high, the dispersion of the ion beam might accordingly be excessive. Hence, the axial magnetic field used in the embodiment of the present invention was at the level specified above.

For an extraction diameter of an ion beam of 100 mm in the aforementioned embodiment, the uniformity of the ion beam on the substrate 19 having a diameter of 75 mm was $\pm 10\%$, and the angle of divergence of the beam was about 5 degrees. With an acceleration voltage of 1 KV, moreover, the ion current density in the ion extracting electrode 15 was 1.5 to 2.0 mA/cm$^2$.

The characteristics of the leakage magnetic field in this first embodiment of the present invention are illustrated in FIG. 4. These characteristics are determined by examining the axial component of the magnetic flux density at the center axis of the discharge chamber 1. FIG. 4 shows the magnetic field inside and outside the discharge chamber when the field of about 1,000 Gauss (0.1 Tesla) was applied by the coil 2 as described. In FIG. 4, the horizontal axis is the distance z (in mm) upwardly from a zero point along the vertical axis of the apparatus. The location of the coil 2 is indicated.

The field characteristics in the case of the embodiment shown in FIGS. 3(a) and 3(b) are plotted in FIG. 4 as a solid curve, and the characteristics in the case where the field is supplied in the same apparatus by the solenoid coil 2 only are plotted as a single-dotted curve 101. In FIGS. 3(a) and 3(b), the grid of the ion extracting electrode 15 closest to the plasma is located at a position of z=90 (mm), at which the leakage magnetic field is at about 250 Gauss (0.025 Tesla) and far lower than the value of 800 Gauss (0.08 Tesla) in the equivalent case using the solenoid coil only (line 101). The leakage magnetic field at the substrate 19 was only about 30 Gauss (0.003 Tesla) in FIGS. 3(a) and 3(b).

This sharp reduction of the field outside the region of the coil 2 is due to the presence of the permanent magnets 3, whose field tends to cancel that of the coil 2 outside the coil 2.

Since the magnitude of the axial magnetic field in the discharge chamber can be increased to a value as high as about 1,000 Gauss (0.1 Tesla) in the first embodiment of the present invention, it is possible to establish a sufficiently dense ion beam and at the same time to reduce the leakage magnetic field at the locations of the ion beam extracting electrode 15 and the substrate 19. Thus, it is possible to achieve the benefits that even a magnetic material can be treated and a small dispersion of the ion beam occurs.

This effect of the present invention is attained in the apparatus of this embodiment of the present invention as a result of the fact that the magnetic field established by the permanent magnets 3 arranged around the discharge chamber 1 is a unidirectional field extending in the axial direction of the discharge chamber at the location within the coil and extends transversely throughout the plasma-generation region, i.e. all across the chamber 1.

Figure 1A:
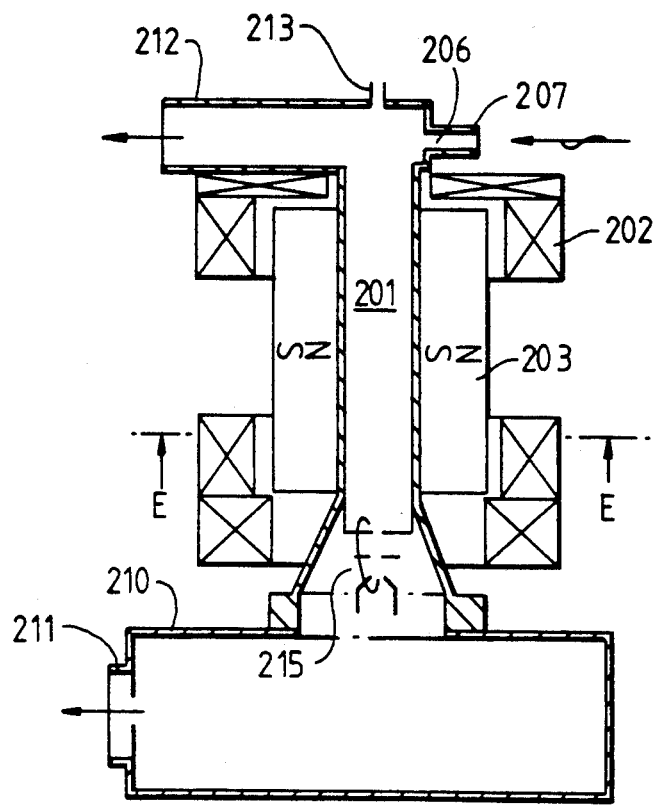
FIGS. 1(a) and 1(b) are sectional views of a first prior art structure discussed above, FIG. 1(b) being a transverse section at line E—E of FIG. 1(a)
Figure 1B:
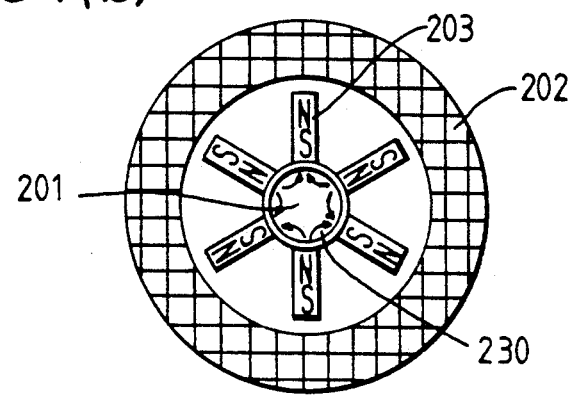
Figure 2:
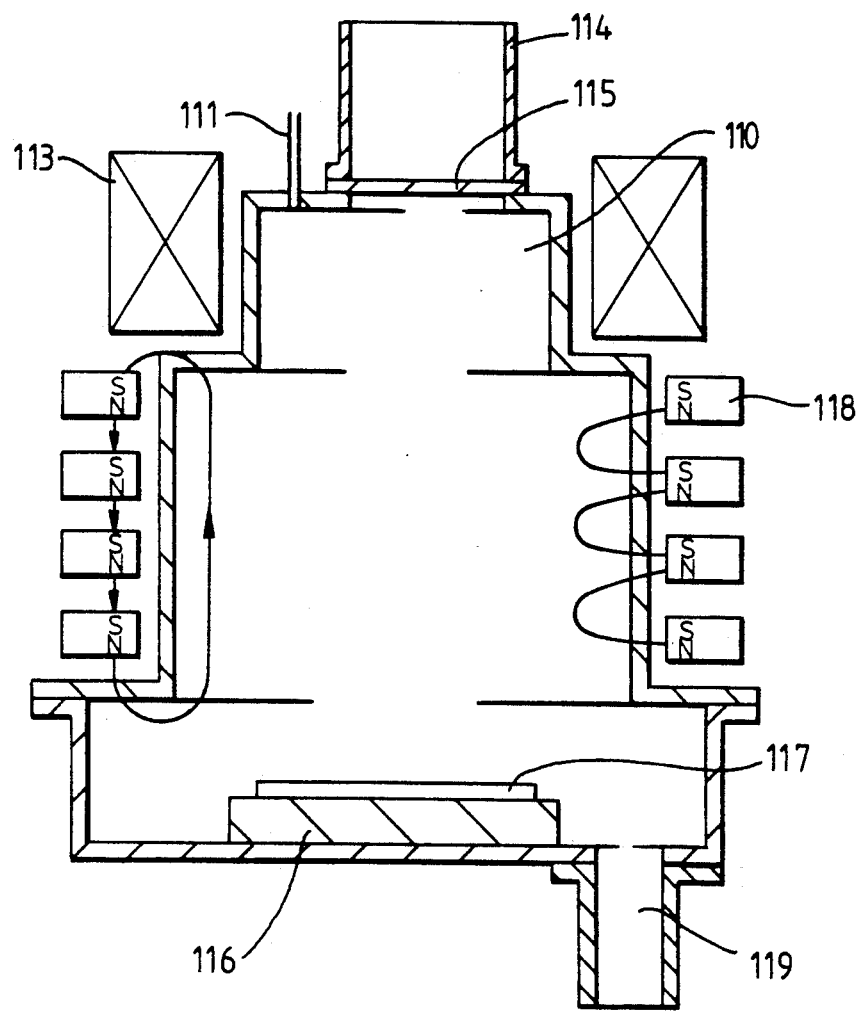
FIG. 2 is a sectional view of a second prior art structure discussed above.

In the conventional technology described with reference to FIG. 1, a magnetic field is established also by permanent magnets and a solenoid coil, but the permanent magnet arrangement generates a multipolar magnetic field which has no component of magnetic field in the axial direction but only in a direction perpendicular to the axial direction. Thus it cannot achieve the aforementioned effect that the leakage magnetic field is reduced.

Figure 5A:
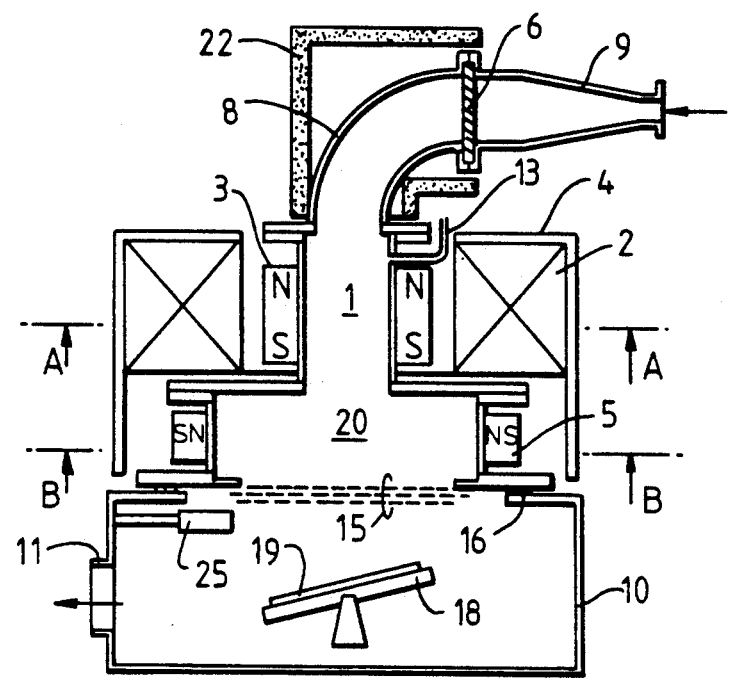
FIGS. 5(a) and 5(b), FIGS. 6(a), 6(b) and 6(c), and FIG. 7 are sectional views showing the structures of second, third and fourth embodiments of the present invention.
Figure 5B:
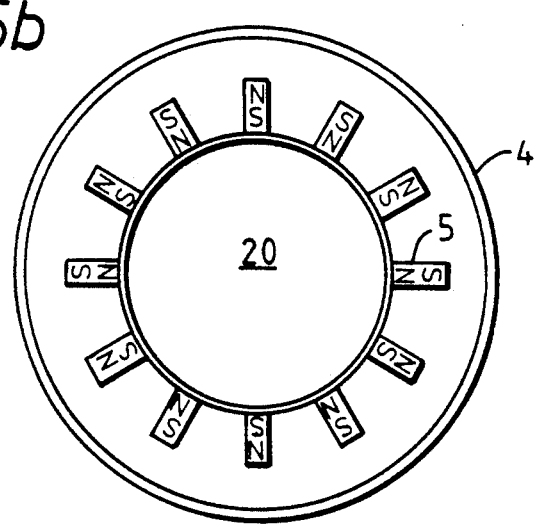

FIGS. 5(a) and 5(b) show a second embodiment of the present invention. FIG. 5(a) is a longitudinal axial section and FIG. 5(b) is a section on line B—B of FIG. 5(a). The same reference numerals are used for parts identical to those of the embodiment of FIG. 3. The section at line A—A of FIG. 5(a) is identical to that shown in FIG. 3(b).

The embodiment shown in FIG. 5(a) is provided with a plasma expanding chamber 20 between the discharge chamber 1 and the treatment chamber 10. To the other end of the discharge chamber 1, is connected a vacuum waveguide 8 which has a right angle bend beyond which is the microwave introducing window 6 and a atmospheric waveguide 9. The vacuum waveguide 8 is surrounded by a magnetic shield 22 to eliminate magnetic field in the vacuum waveguide 8 substantially. The vacuum waveguide 8 is made of SUS material but may be made of aluminum or the like.

To the discharge chamber 1, there is connected the gas introducing tube 13, and the chamber 1 is surrounded by the permanent magnet arrangement 3, the solenoid coil 2 and the magnetic shield 4 like the case of the embodiment of FIGS. 3(a) and 3(b). To the other end of the discharge chamber 1, there is connected the plasma expanding chamber 20 which is equipped with the ion extracting electrode 15 at its side connecting to the treatment chamber 10.

The plasma expanding chamber 20 is constructed as a cylindrical container of SUS material and is surrounded with a number of radial permanent magnets (e.g. Sm-Co magnets), which have alternate N and S poles adjacent the chamber 20, as shown in FIG. 5(b). This gives a multipolar field in the chamber 20.

In the treatment chamber 10, there are disposed the substrate holder 18, the substrate 19 and the neutralizer 25 like the case of the embodiment of FIGS. 3(a) and 3(b).

The operation of this second embodiment will be described in the following. First, the treatment chamber 10 is evacuated to $1 \times 10^{-6}$ Torr ($1.3 \times 10^{-4}$ Pa), and the solenoid coil 2 is energized, while the discharge chamber 1 is supplied with oxygen gas, to establish an axial magnetic field of about 1,000 Gauss (0.1 Tesla) in the discharge chamber 1.

Microwaves of 2.45 GHz are supplied, and a plasma is established in the discharge chamber 1. The plasma density, which is obtained in the discharge chamber 1 by adjusting the axial magnetic field, was $5 \times 10^{11}$ to $1 \times 10^{12}$ cm$^{-3}$. This plasma is diffused in the plasma expanding chamber 20 so that its density is made uniform to $6 \times 10^{10}$ to $1.2 \times 10^{11}$ cm$^{-3}$ in the vicinity of the ion extracting electrode 15.

For an extraction diameter of the ion beam of 200 mm, the uniformity of the ion beam on the substrate 19 having a diameter of 150 mm was ±5%, and the divergence angle of the beam was 3 to 4 degrees. With an acceleration voltage of 500V, moreover, the ion current density at the ion extracting electrode 15 was 0.5 to 0.7 mA/cm$^2$.

The characteristics of the leakage magnetic field in this second embodiment of the present invention are presented in FIG. 4 and are identical to the embodiment of FIGS. 3(a) and 3(b). Moreover, the leakage magnetic field in the position (z=0 mm) of the grid of this embodiment closest to the plasma is about 140 Gauss (0.014 Tesla), which is far lower than about 470 Gauss (0.047 Tesla) of the case using the solenoid coil 2 only to produce the magnetic field. The leakage magnetic field at the substrate 19 was about 15 Gauss (0.0015 Tesla).

In the second embodiment of the present invention of FIGS. 5(a) and 5(b), the microwave introducing window 6 is so positioned as to be invisible from the discharge chamber 1. This prevents the microwaves from becoming unable to be introduced into the discharge chamber 1, because the particles emitted by sputtering from the substrate 19 being treated, which may be a metallic thin film, stick to the microwave introducing window 6. Such adhering particles reflect the coming microwaves.

If the plasma is established in the vacuum waveguide 8, the microwaves are obstructed and may fail to go as far as the discharge chamber 1 sufficiently. In order to avoid this, therefore, the magnetic shield 22 is provided to eliminate the magnetic field in the vacuum waveguide 8, reducing the generation of the plasma in that portion.

Thus in the structure of FIGS. 5(a) and 5(b), there can be attained effects similar to those of the first embodiment of the present invention, shown in FIGS. 3(a) and 3(b). Moreover, it is possible to establish an excellent uniform ion beam of large area. In this embodiment, still moreover, the structure can be modified to provide one plasma expanding chamber with a plurality of discharge chambers, if an ion beam of large area is required.

This second embodiment of the present invention thus far described is suitable especially if it is used as an ion source for a reactive ion beam etching apparatus having a large area.

Figure 6A:
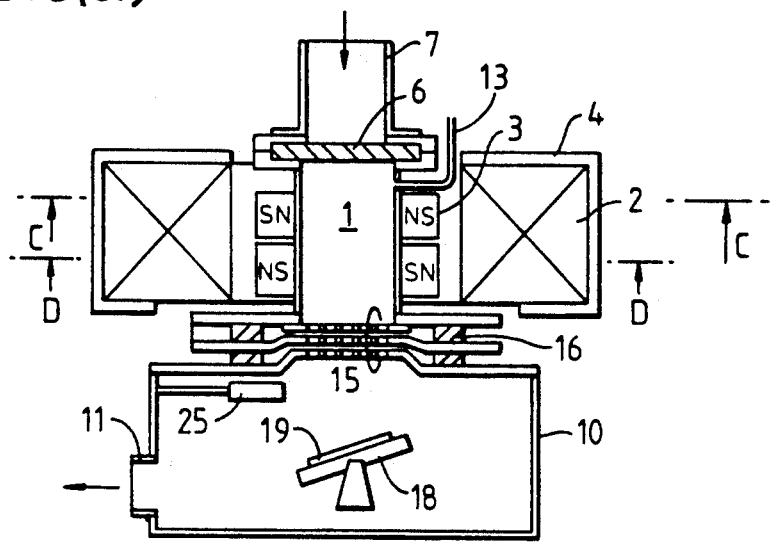
Figure 6B:
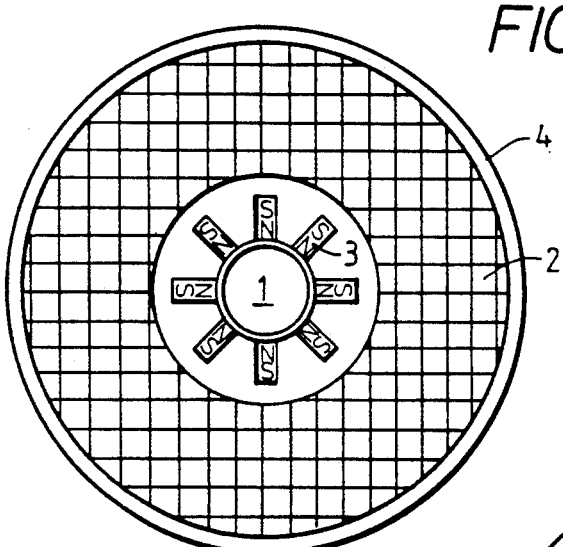
Figure 6C:
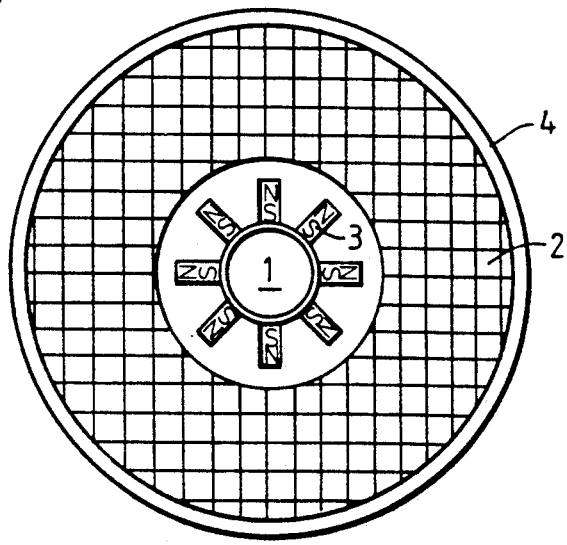

The third embodiment of the present invention will be described with reference to FIGS. 6(a), 6(b) and 6(c), in which FIG. 6(a) is a longitudinal axial section and FIGS. 6(b) and 6(c) are sections taken along lines C—C and D—D, respectively. In FIGS. 6(a), 6(b) and 6(c), the same reference numerals are used for parts identical to those of FIGS. 3(a) and 3(b). The third embodiment is substantially identical to that of the first embodiment shown in FIGS. 3(a) and 3(b), except in the manner of arrangement of the permanent magnets 3 around the discharge chamber 1. In this case, the discharge chamber 1 is surrounded by eight pairs of radial permanent magnets 3, which are arranged so that all the upper permanent magnets have their N poles and all the lower permanent magnets have their S poles directed towards the discharge chamber 1. This arrangement of permanent magnets provides a unidirectional magnetic field extending fully across the plasma-generation region in the chamber 1, as in the embodiment of FIGS. 3(a) and 3(b).

The characteristics of the ion beam extracted are substantially identical to those of the embodiment of FIGS. 3(a) and 3(b), but the leakage magnetic field is different. The characteristics of the leakage magnetic field, are shown by a broken curve in FIG. 4. The axial magnetic field at the center axis of the discharge chamber 1 is abruptly reduced at the two ends of the discharge chamber 1. The leakage magnetic field at the grid of the ion extracting electrode 15 closest to the plasma is about 250 Gauss (0.025 Tesla), i.e. as high as in the embodiment of FIGS. 3(a) and 3(b) but has a higher value than that of FIGS. 3(a) and 3(b) at greater distance. Nevertheless, the leakage magnetic field at the substrate 19 is about 35 Gauss (0.0035 Tesla) and raises no problem in the treatment of a magnetic material.

This arrangement of the permanent magnets of FIGS. 6(a), 6(b) and 6(c) is suited for the case of using a discharge chamber having a relatively large diameter, and is advantageous in that an axial magnetic field exceeding 1,000 Gauss (0.1 Tesla) can be established relatively easily in the discharge chamber.

Thus in the third embodiment of the present invention, there can be attained effects similar to those of the first embodiment.

Figure 7:
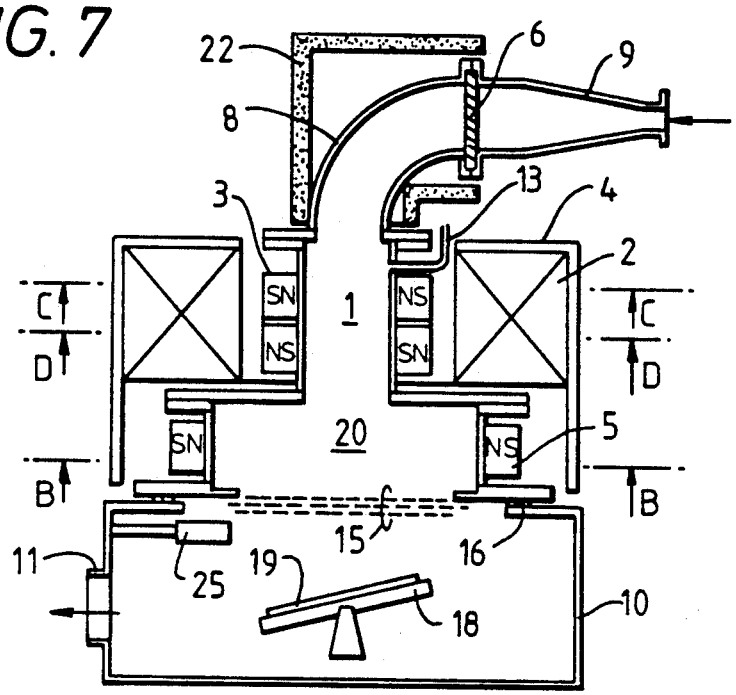

FIG. 7 is a longitudinal axial section showing the structure of a fourth embodiment of the present invention, and employs the same reference numerals for parts identical to those of FIGS. 3(a) and 3(b) and 5(a) and 5(b). Transverse sections along lines C—C, D—D and B—B in FIG. 7 are identical to those of FIGS. 6(b) and 6(c) and FIG. 5(b), respectively. This fourth embodiment of the present invention is substantially identical to that shown in FIGS. 3(a) and 3(b), but is different in that the permanent magnets 3 around the discharge chamber 1 are arranged as in the third embodiment of FIGS. 6(a), 6(b) and 6(c), in that the upper permanent magnets have their N poles and the lower permanent magnets have their S poles directed towards the discharge chamber 1.

The characteristics of the ion beam extracted are substantially identical to those of the embodiment of FIGS. 5(a) and 5(b), and the characteristics of the leakage magnetic field are represented by the broken curve in FIG. 4. Specifically, the leakage magnetic field at the grid of the ion extracting electrode 15 closest to the plasma is about 180 Gauss (0.018 Tesla), and the leakage magnetic field at the position of the substrate 19 is about 20 Gauss (0.002 Tesla).

Since, in this embodiment, there is hardly established any magnetic field at the extraction of the ion beam, an ion beam having a small divergence can be generated and used for the treatment of even a magnetic material without any problem. This fourth embodiment of the present invention therefore provides effects similar to those of the embodiment of FIGS. 5(a) and 5(b).

The embodiments of the present invention thus far described has been directed to the case in which oxygen is used as the gas to be introduced. However, not only oxygen but also chlorine gas or fluorocarbon gas (e.g. $CF_4$) can also for example be used in the present invention with similar effects. When these gases are used, too, the ion source of the present invention can be stably operated for a long time because it is not equipped with any filament.

Figure 8:
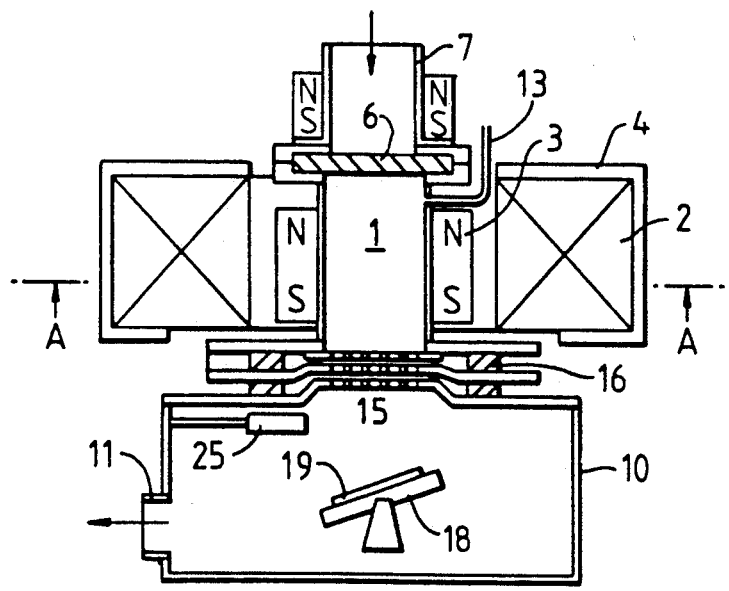
FIG. 8 is a sectional view of a modified form of the apparatus of FIGS. 3(a) and 3(b), forming a fifth embodiment of the invention.

FIG. 8 is a longitudinal axial section of the fifth embodiment of the invention which is identical to the embodiment of FIGS. 3(a) and 3(b) except that an additional ring of axially extending permanent magnets 17 is provided outside the waveguide 7 immediately above the window 6. The magnets 17 are arranged, like the magnets 3, with all N poles upwards and all S poles downwards. This arrangement of magnets 17, at the microwave entry side of the plasma coil 2, increases the magnetic field axially outside the coil at the microwave entry side, by adding a field in the same direction as that of the plasma coil 2. This additional field improves the transmission of the microwave energy through the entry port into the plasma region, and also helps to provide a self-cleaning action of the port window 6 by providing an axially directed magnetic flux at the window 6. The tendency of particles to adhere to the window 6, blocking the passage of microwaves, is reduced. The sectional view of the embodiment of FIG. 8 at the line A—A is given by FIG. 3(b).

Figure 9:
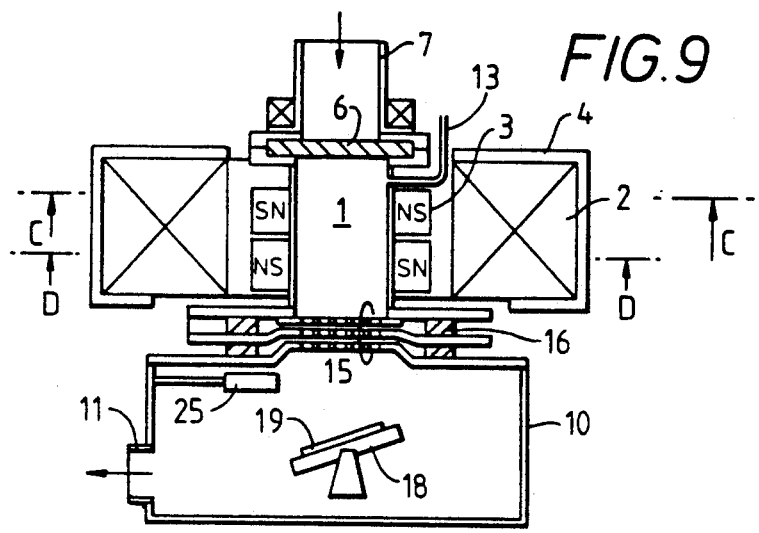
FIG. 9 is a sectional view of a modified form of the apparatus of FIGS. 6(a) to 6(c), forming a sixth embodiment of the present invention.

FIG. 9 is an axial longitudinal view of the sixth embodiment which is identical to the embodiment of FIGS. 6(a), 6(b) and 6(c) except that a coil 17a is arranged around the waveguide 7 immediately above the entry window 6. This coil is energized during plasma generation to provide an axial magnetic field in the same direction as that of the plasma coil 2. The effects of the field produced by the coil 17a are the same as those of the permanent magnets 17 of FIG. 8. The sectional views of the structure of FIG. 9 on the lines C—C and D—D are given by FIGS. 6(b) and 6(c).

Figure 10A:
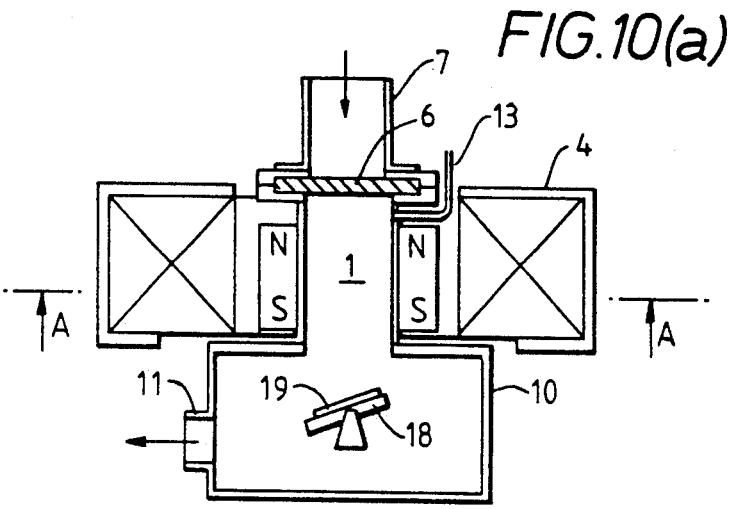
FIGS. 10(a) and 10(b), and FIGS. 11(a) and 11(b) are sectional views showing the structures of seventh and eighth embodiments of the present invention.
Figure 10B:
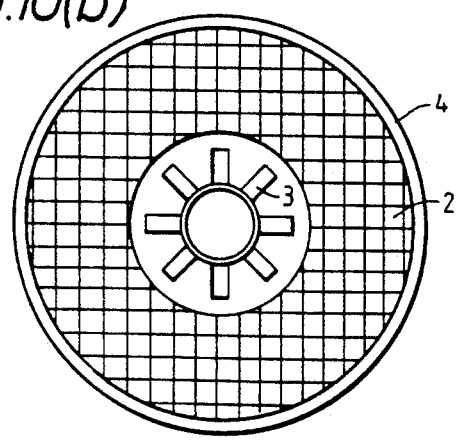

FIG. 10(a) is a section showing the structure of a seventh embodiment of the present invention, and FIG. 10(b) is a section taken along line A—A in FIG. 10(a). The same reference numerals are used for parts identical to those of the foregoing embodiments. This embodiment is used as a plasma etching apparatus and has a structure substantially identical to that of the embodiment of FIGS. 3(a) and 3(b) except that the apparatus is not equipped with the ion extracting electrode 15 and the neutralizer 25 of FIG. 3(a). Moreover, this embodiment does not require any insulator for maintaining the potential of the discharge chamber 1 at a higher level than that of the treatment chamber 10. The substrate 19 to be treated is supplied with a DC or high-frequency bias voltage by means not shown. In this embodiment, the leakage magnetic field at the substrate 19 is about 40 Gauss (0.004 Tesla), which is slightly higher than that of the embodiment of FIGS. 3(a) and 3(b) but will not affect the magnetic characteristics of a magnetic sample. Thus, this embodiment of the present invention can be used to etch a magnetic sample without any problem.

In use of this embodiment of FIGS. 10(a) and 10(b), at the time of introducing the oxygen gas, the microwave power was 500W, and the plasma density was $1 \times 10^{11}$ to $2 \times 10^{11}$ cm$^{-3}$. The carbon etching rate was 10 to 15 nm/min. Since the axial magnetic field of the discharge chamber 1 can be raised to as high as about 1,000 Gauss (0.1 Tesla) a highly dense plasma can be established to etch even a magnetic sample at a high rate.

Figure 11A:
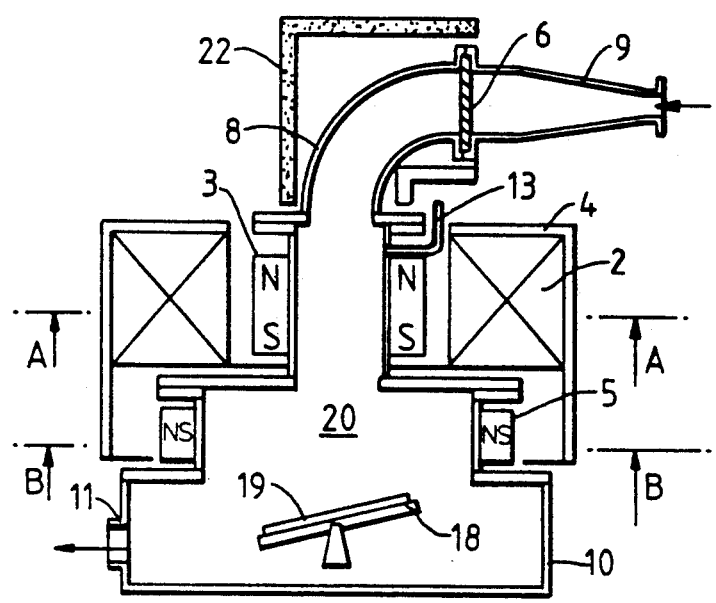
Figure 11B:
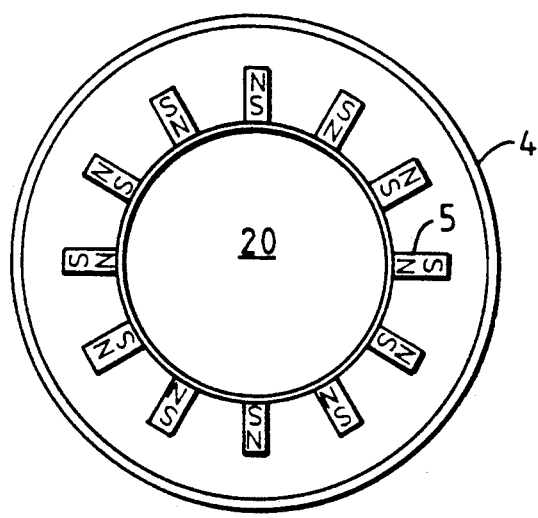

FIG. 11(a) is a section showing the structure of an eighth embodiment of the present invention, and FIG. 11(b) is a section taken along line B—B of FIG. 11(a). The same reference numerals are used for parts identical to those of the earlier embodiments of the present invention. The section taken along line A—A is identical to that of FIG. 10(b). This embodiment of the present invention is used as a plasma etching apparatus of large area and is substantially identical to that of the embodiment of FIG. 5, except that it is not equipped with the ion extracting electrode 15 and the neutralizer 25. A bias voltage can be applied to the substrate 19 as in the embodiment of FIG. 9. The leakage magnetic field at the substrate 19 is drastically reduced to as low as about 20 Gauss (0.002 Tesla), so that the embodiment of the present invention can be used to etch a magnetic sample without any problem.

In use of the embodiment of FIGS. 11(a) and 11(b), at the time of introducing the oxygen gas, the microwave power was 500W, and the carbon etching rate was 6 to 9 nm/min. The dispersion of the etching rate on a substrate having a diameter of 150 mm was ±5%.

In this eighth embodiment of the present invention, there can be attained effects similar to those of the embodiment thus described with reference to FIGS. 10(a) and 10(b).

The embodiments of the present invention described with reference to FIGS. 10(a) and 10(b) and 11(a) and 11(b) may be adapted by changing the permanent magnets 3 arranged around the discharge chamber 1 to have an arrangement shown in FIGS. 6(a), 6(b) and 6(c).

To summarize, with the present invention as illustrated by these embodiment, the magnetic field of the discharge chamber can be intensified whereas the leakage magnetic field in the other portions can be weakened by superposing the magnetic field generated by the solenoid coil and the magnetic field generated by the permanent magnets. As a result, the intensity of the magnetic field of the discharge chamber can be reduced to about 250 Gauss (0.025 Tesla) or less at the ion extracting electrode and to a few tens of Gauss or less at the position of the workpiece, while holding a level of about 1,000 Gauss (0.1 Tesla) necessary for the microwave discharge. Thus, there can be attained an effect that an ion beam having a sufficient amount and a small divergence (less than 5 degrees) can be established to treat a workpiece e.g. one of magnetic material.

Moreover, a plasma expanding chamber can be used to make uniform the plasma density therein. Thus, there can be attained an effect that a uniform ion beam having a relatively large diameter and a uniformity of ±5% can be generated on a substrate having a diameter of 150 mm.

When the present invention is applied to plasma etching apparatus, the leakage magnetic field in a certain position of the workpiece can be reduced to have a magnitude of a few tens of Gauss or less. By using the plasma expanding chamber, furthermore, the etching can be accomplished at a uniformity of about ±5% in the treatment of the substrate having a diameter of 150 mm.

What is claimed is:

1. A plasma-generation apparatus consisting of:
    a plasma discharge chamber which includes a plasma-generating region;
    means for applying microwave energy to said chamber;
    means for introducing plasma-forming gas to said chamber; and
    means for applying a magnetic field to said plasma-generating region of said chamber;
    said means for applying a magnetic field consisting of:
    at least one electromagnetic coil extending around said chamber for generation in said plasma-generation region a magnetic field oriented in an axial direction of said coil, and
    a permanent magnet arrangement at least partly located radially within said coil so as to provide a unidirectional magnetic field which uniformly extends through the whole of said plasma-generation region as seen in a radial cross-section and is oriented in said axial direction of said coil,
    wherein said permanent magnet arrangement consisting of a plurality of permanent magnets arranged around said chamber, each permanent magnet being disposed such that the magnetic poles thereof extend in a direction parallel to said axial direction of said coil.

2. An apparatus according to claim 1 having means for extracting an ion beam from said chamber.

3. An apparatus according to claim 1 wherein said chamber has a second region connected to said plasma-generation region and a plurality of permanent magnets arranged to generate a multi-polar magnetic field in said second region.

4. An apparatus according to claim 1 wherein said chamber has an axial end comprising a microwave inlet window, and said apparatus further consisting of:
    a waveguide for providing microwave radiation extending to said window outside said chamber; and
    magnetic field generating means arranged around said waveguide so as to generate at said window a magnetic field extending axially in the same direction as the unidirectional magnetic field generated, within said coil in said discharge chamber, by said permanent magnet arrangement.

5. An apparatus according to claim 1 having a portion of said chamber which is bounded by a microwave guide which is not straight and is surrounded by a magnetic shield.

6. A method of generating a plasma comprising the steps of:
    supplying a plasma-forming gas and microwave energy to a chamber;
    applying, by an electromagnetic coil surrounding said chamber, a magnetic field in said chamber in an axial direction of said coil; and
    locating a permanent magnet arrangement inside said coil so as to provide a unidirectional magnetic field inside said coil and in said chamber extends in the same direction as said magnetic field generated by said coil;
    wherein said permanent magnet arrangement consists of a plurality of permanent magnets arranged around said chamber, each permanent magnet being disposed such that the magnetic poles thereof extend in a direction parallel to said axial direction of said coil.

7. A method according to claim 6 wherein the intensity of the magnetic field (Bc) applied in said chamber at a central axial point of said coil by said coil and the intensity of the unidirectional magnetic field (Bm) provided by said permanent magnet arrangement in said chamber satisfy the relation $$0.5 \leq Bc/Bm \leq 4.$$

8. In a plasma-generating apparatus having a solenoid coil for generating in an axial direction of said coil a magnetic field in a plasma-generating chamber to which microwave power is applied, the improvement consisting of:

a permanent magnet arrangement located so as to provide a unidirectional magnetic field which increases the intensity of said magnetic field generated by said coil at a region in said chamber surrounded by said coil and reduces the intensity of said magnetic field generated by said coil outside of said region at a location adjacent to at least one axial end of said coil;

wherein said permanent magnet arrangement consists of a plurality of permanent magnets arranged around said chamber, each permanent magnet being disposed such that the magnetic poles thereof extend in a direction parallel to said axial direction of said coil.

* * * * *